United States Patent [19]

Terakado et al.

[11] Patent Number: 5,058,797

[45] Date of Patent: Oct. 22, 1991

[54] DETECTION METHOD FOR WIRE BONDING FAILURES

[75] Inventors: Yoshimitsu Terakado; Tohru Mochida; Nobuto Yamazaki, all of Tokyo, Japan

[73] Assignee: Kabushiki Kaisha Shinkawa, Tokyo, Japan

[21] Appl. No.: 523,668

[22] Filed: May 14, 1990

[30] Foreign Application Priority Data

May 15, 1989 [JP] Japan .................................. 1-118598

[51] Int. Cl.⁵ ........................................ H01L 21/603
[52] U.S. Cl. ........................................ 228/104; 228/179
[58] Field of Search ............... 228/103, 104, 179, 4.5, 228/9

[56] References Cited

U.S. PATENT DOCUMENTS 3,763,545 10/1973 Spanjer ............................... 228/103
4,441,248 4/1984 Sherman et al. .................... 228/104
4,555,052 11/1985 Kurtz et al. ......................... 228/104
4,586,642 5/1986 Dreibelbis et al. ................. 228/104

FOREIGN PATENT DOCUMENTS 77467 7/1978 Japan .................................. 228/103
26659 2/1980 Japan .................................. 228/104
113338 9/1980 Japan .................................. 228/103

Primary Examiner—Samuel M. Heinrich
Attorney, Agent, or Firm—Koda and Androlia

[57] ABSTRACT

Method for detecting failures in wire bonding is performed by applying a minimal voltage to bonding wire between the first and second bonding steps, between the second bonding step and bonding wire cutting step, and before the next first bonding step. Thus, whether or not the first bonding and the second bonding have been performed properly and whether or not the wire condition before the next first bonding is proper are all detected before advancing next bonding.

2 Claims, 4 Drawing Sheets

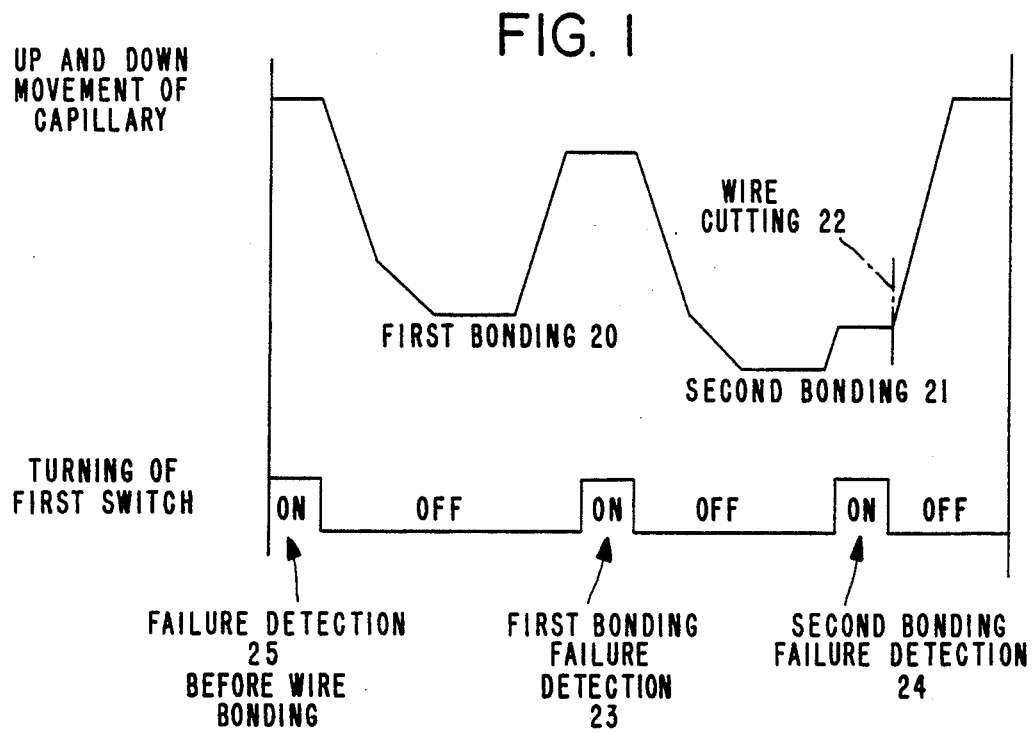

DETECTION METHOD FOR WIRE BONDING FAILURES

BACKGROUND OF THE INVENTION

1. Field of the Invention

The present invention relates to a method for detecting failures in wire bonding in wire bonding machines.

2. Prior Art

One example of prior art method for detecting failures in wire bonding is disclosed in Japanese Patent Application Kokai (Laid-Open) No. 59-88842. FIGS. 5 through 7 show this prior method.

As seen in FIG. 5, a lead frame 2 fixed with a pellet 1 is placed at a specific location on a testing table 3.

The bonding wire ("wire") 4 which is to be connected to the pellet 1 and the lead frame 2 is wound on a spool 5. One end of the wire 4 is inserted in the capillary 7 through a clamper 6, and the other end of the wire 4 is connected to a terminal 8. An electric torch 9, that is used for melting the end of the wire 4 to form a ball 4a, is positioned near the capillary 7.

The terminal 8 is connected to a common contact 10a of a first switch 10 which, for example, is a lead relay. A closed contact 10b of the first switch 10 is used for grounding, and an open contact 10c of the first switch 10 is connected to a detector 11 and to resistor 12. The resistor 12 is selectively connected to one of direct current sources 14 and 15 by a second switch 13.

FIG. 6 is a graph showing the upward and downward movements of the capillary 7 and timing of turning of the switch 10. The first switch 10 is turned at the states shown in FIGS. 7(c) and 7(d).

If the pad of the pellet 1 is in the forward direction (see FIG. 2 for "forward direction"), the second switch 13 is connected to the direct-current power supply 14 so as to receive positive voltage. If the pad is in the backward direction (see FIG. 2 for "backward direction"), the second switch 13 is connected to the direct current power supply 15 so as to receive negative voltage.

In operation, first, as seen in FIG. 7(a), the ball 4a is formed at the end of the wire 4, which is placed at the bottom of the capillary 7, by the discharge from the electric torch 9. The capillary 7 is then moved down so that the wire 4 is bonded to the pellet 1 (first bonding) as seen in FIG. 7(b). Then, as seen in FIGS. 7(c), 7(d) and 7(e), the capillary 7 is raised, moved above the second bonding point and then lowered. During this movement, as seen from FIG. 6, the switching signal for the first switch 10 is activated, and the first switch 10 is turned to the open contact 10c.

In this process, if the wire 4 is connected (or bonded) to the pellet 1, a minimal current flows to the wire 4 from the direct-current power supply 14 or 15 via the second switch 13, the resistor 12, the first switch 10 and the terminal 8, but the current does not flow to the detector 11. However, if the wire 4 is not connected (or bonded) with the pellet 1, the current flows to the detector 11 and not to the wire 4. As a result, the wire bonding failure signal 11a is output.

If the wire connection to the pellet is normal (or the bonding has been completed properly at the first bonding point), the capillary 7 is lowered, and the wire 4 is connected to the second bonding point as seen in FIG. 7(e). Then, as seen in FIG. 7(f), the clamper 6 is closed, and only the capillary 7 moves up to a predetermined height. After this, as seen in FIG. 7(g), both the clamper 6 and the capillary 7 are moved up together, and the wire 4 is cut at the second bonding point.

The wire 4b is connected to the first bonding point and the second bonding point as described above. Then the capillary 7 is moved upward until it reaches above the first bonding point at which next bonding is performed, and as seen in FIG. 7(a), the ball 4a is formed, and the process described above will be repeated.

However, the problem in the prior art method described above is that only the failure in the first bonding (or non-bonding) is detected and not in the second. Thus, bonding reliability is inferior.

SUMMARY OF THE INVENTION

Accordingly, it is an object of the present invention to provide a method for detecting any failures in wire bonding process so that the bonding reliability can be improved.

The object of the present invention is accomplished by a unique method wherein a minimal voltage is applied to the wire (a) between the end of the first bonding and before the second bonding, (b) between the end of the second bonding and before the cutting action of the wire, and also (c) before the next first wire bonding. Thus, any failures which would occur during the bonding can be detected; in other words, the first bonding failure is first detected, then the second bonding failure is detected, and the failure occurring before the next wire bonding takes place is also detected.

With such a method, the reliability of the bonding can be improved because all of the possible bonding failures, including the first bonding failure, the second bonding failure, and the failure made before the next wire bonding, can be detected.

DETAILED DESCRIPTION OF THE DRAWINGS

FIG. 1 is a graph showing the upward and downward movements of a capillary and the timing of turning of switches employed in the method for detecting wire connection failures according to the present invention;

FIG. 2 is a table referring the detection of failure at the second bonding point in the present invention;

Figure 3A:
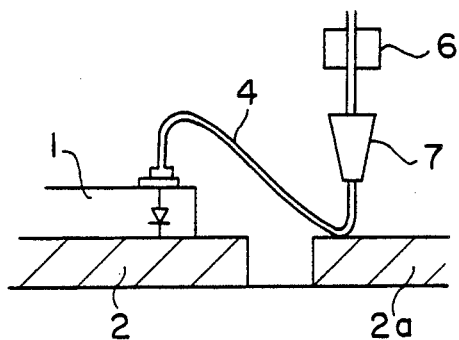
Figure 3B:
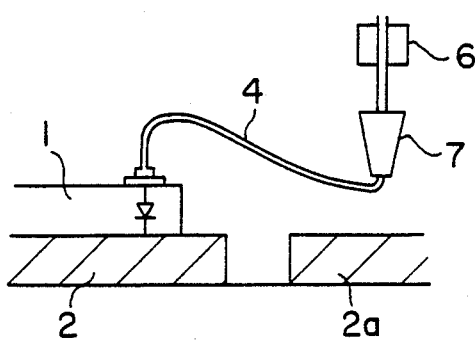
Figure 3C:
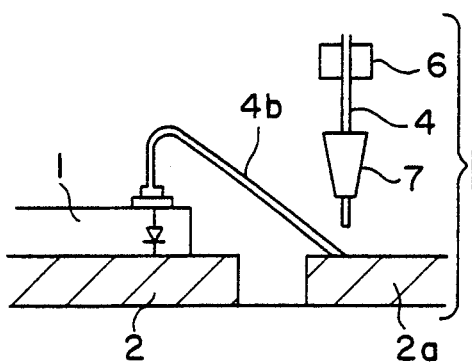
Figure 4A:
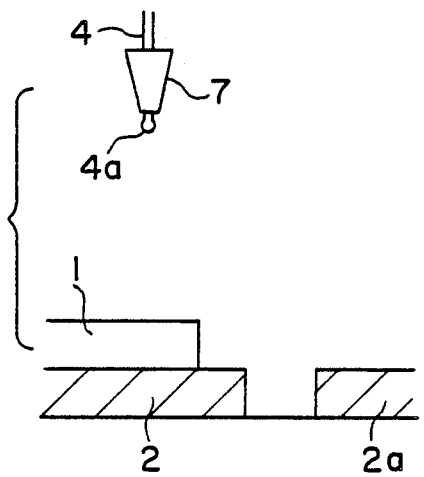
Figure 4B:
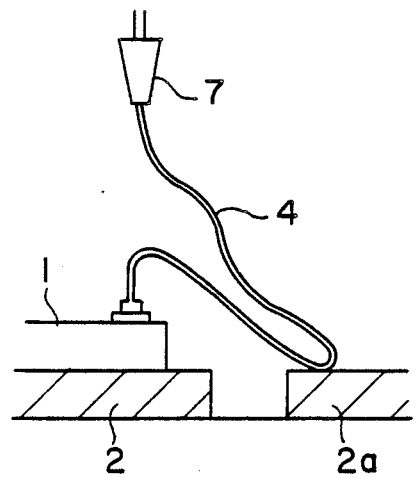
Figure 5:
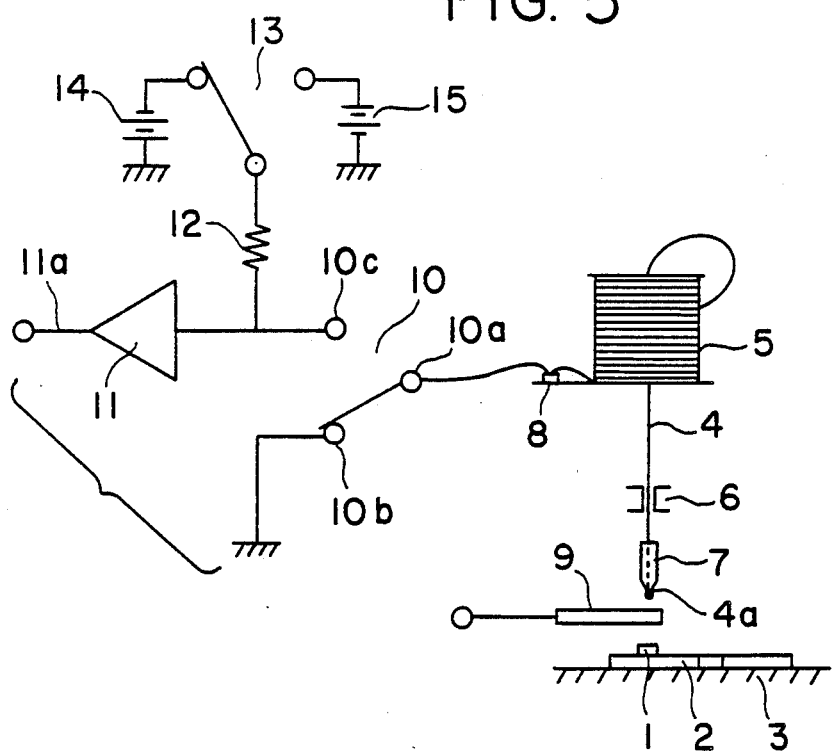
Figure 6:
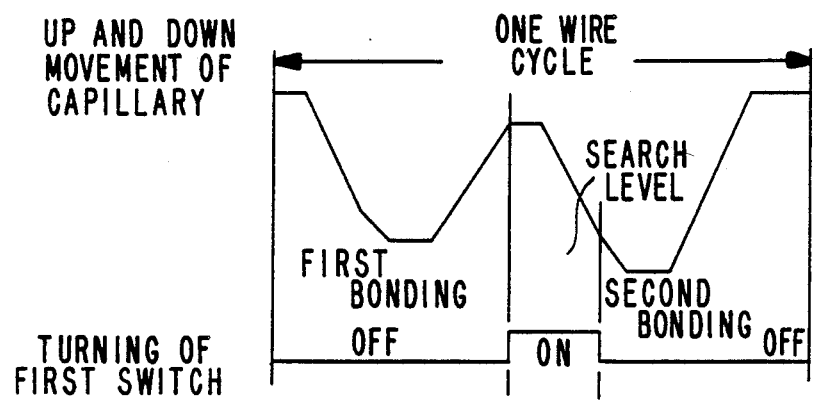

FIGS. 3(a), 3(b) and 3(c) show the states after the second bonding is completed;

FIGS. 4(a) and 4(b) show the states before the second bonding starts;

FIG. 5 is a block diagram showing an example of bonding system employed in the present invention;

FIG. 6 shows the upward and downward movements of the capillary and the timing of turning of switches; and FIGS. 7(a) through 7(g) show the bonding steps in prior art.

DETAILED DESCRIPTION OF THE INVENTION

The present invention will be described below with reference to FIGS. 1 through 4.

As seen from FIG. 1, detection of the first bonding failure 23 is performed between the end of the first bonding 20 and before the second bonding 21. The second bonding failure detection 24 is performed after the second bonding 21 and before the wire cutting 22. Also, the wire failure detection 25 is performed before the next first bonding.

The first bonding failure 23 is detected by the same way as prior art and will not be explained below.

Figure 7A:
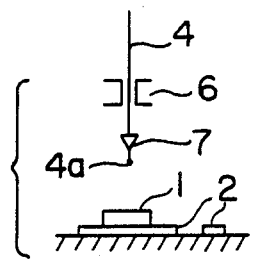
Figure 7B:
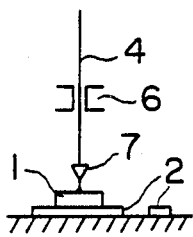
Figure 7C:
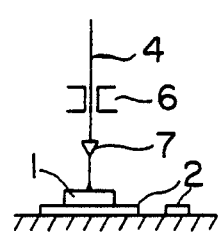
Figure 7D:
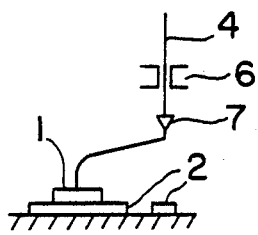
Figure 7E:
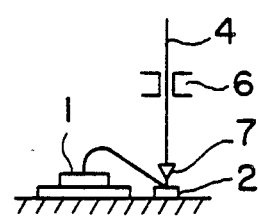
Figure 7F:
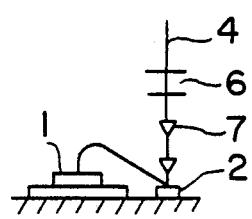
Figure 7G:
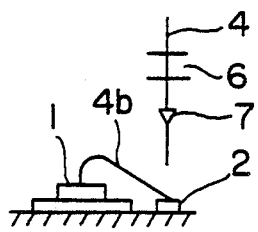

The second bonding failure detection 24 is performed at the bonding step shown in FIG. 7(f).

More specifically, when the capillary 7 is moved up after completion of the second bonding, the first switch 10 shown in FIG. 5 is connected to the open contact 10c before the wire cutting 22. Accordingly, the voltage of either the direct current power supply 14 or 15 is applied to the wire 4 so that it can be checked whether or not the second bonding has been done properly. In this case, if the pad of the pellet 1 is in the forward direction as seen in FIG. 3, the second switch 13 is turned so that it is connected to the direct current power supply 15. The, negative voltage is applied to the wire 4.

FIG. 3(a) shows a proper second bonding, and FIGS. 3(b) and 3(c) show incomplete and improper second bonding, respectively.

FIG. 3(b) shows that the second bonding has not been completed. FIG. 3(c) shows that the wire 4 is cut before the necessary wire cutting as in FIG. 7(g) has actually started, although the wire 4b has been connected to both the first and second bonding points. In case of FIG. 3(c), the length of the wire tail is not stable, and the ball 4a as shown in FIG. 7(a) is not be able to be made properly.

When the bonding is performed properly as shown in FIG. 3(a), a negative voltage applied to the wire 4 is grounded through the lead 2a of the lead frame 2, and the input section of the detector 11 becomes 0 (zero) V. In cases of FIGS. 3(b) and 3(c), electrical current does not flow to the wire 4, and the voltage in the wire becomes negative-applied-voltage, so that the input section of the detector 11 is not 0V. Thus, bonding failure is determined.

Determination of whether the second bonding failure is an incomplete bonding as shown in FIG. 3(b) or improper bonding (length failure of the wire tail) as shown in FIG. 3(c) is made by switching the applied-voltage.

More specifically, when the second bonding failure is detected under the circumstance that a negative voltage is applied to the wire 4 by connecting the second switch 13 to the direct current power supply 15, the second switch 13 is turned to connect to the direct current power supply 14 so as to apply a positive voltage to the wire 4. In this case, if the bonding failure is that shown in FIG. 3(b), the positive voltage applied to the wire 4 flows to the lead frame 2 from the pellet 1, resulting in that the detector 11 reads 0V. If the bonding failure is as shown in FIG. 3(c), the voltage of the wire 4 becomes applied voltage.

Thus, one type of bonding failure as in FIG. 3(b), wherein the positive voltage becomes 0V by the applied voltage, and another type of bonding failure as in FIG. 3(c), wherein the positive voltage remains as the applied voltage, are easily distinguished.

The second bonding failure detection 24 can be summarized as shown in FIG. 2.

If the pad is in the backward direction, the voltage application to the wire 4 is in a direction opposite to such forward direction.

The wire bonding failure detection 25 before the next wire bonding will be explained. In this case, the second switch 13 can be connected to either one of the direct-current power supplies 14 and 15.

Before the capillary 7 begins moving down to the first bonding point, the voltage is applied to the wire 4. As seen in FIG. 4(a), if the wire 4 is extended under the capillary 7 and the ball 4a is formed at the end of the wire, the detector 11 takes on the applied voltage. If the situation is as shown in FIG. 4(b) in which the wire 4 has not been cut in the previous step, the detector 11 reads 0 V. Therefore, the judgment is made so that it is proper if the detector 11 is not 0V.

In the detections 23, 24 and 25, it is possible that the timing of turning the switches 10 and 13 and the pad conditions are memorized beforehand in a microcomputer (not shown), so that the switching of the applied voltages are all computerized. It is preferable to use a semiconductor circuit to improve the reliability of the switches 10 and 13 and also for shortening the operating time.

As described above, according to the present invention, the reliability of the bonding can be improved because all the bonding failures (the first bonding failure, the second bonding failure, and the failure before the next first bonding) can be detected.

We claim:

1. A method for detecting failures in wire bonding characterized by the application of a minimal voltage to a bonding wire between the end of first bonding step and beginning of a second bonding step, between the end of the second bonding step and the bonding wire cutting step, and between said bonding wire cutting step and a beginning of a next first bonding step so as to detect a first bonding failure, a second bonding failure, or a failure occurring before the next first bonding step.

2. A method for detecting wire bonding failures at first and second bonding points comprises the steps of:
   applying a minimal voltage to a bonding wire after bonding at said first bonding point and before bonding a said second bonding point;
   applying a minimal voltage to said bonding wire after bonding at said second bonding point and before execution of cutting of said bonding wire; an
   applying a minimal voltage to said bonding wire after said cutting of said bonding wire and before bonding at a first bonding point of next bonding process.

* * * * *